United States Patent [19]

Schmidt et al.

[11] Patent Number: 4,738,632

[45] Date of Patent: Apr. 19, 1988

[54] ELECTRICAL ASSEMBLY WITH MODULAR CARRIERS FOR SIGNAL PROCESSING MODULES

[75] Inventors: Heinz Schmidt, Kümmersbruck; Reinhard Schirbl, Schwandorf; Otto Meusel, Erlangen, all of Fed. Rep. of Germany

[73] Assignee: Siemens Aktiengesellschaft, Munich, Fed. Rep. of Germany

[21] Appl. No.: 8,784

[22] Filed: Jan. 29, 1987

[30] Foreign Application Priority Data

Feb. 6, 1986 [DE] Fed. Rep. of Germany ....... 3603750
Oct. 3, 1986 [DE] Fed. Rep. of Germany ....... 3633785

[51] Int. Cl.$^4$ .............................................. H05K 7/10
[52] U.S. Cl. .................................... 439/341; 361/393; 439/928
[58] Field of Search ............ 339/17 M, 17 LM, 17 N, 339/198 G, 198 GA; 361/393, 394, 395, 413, 415; 439/341, 59-62, 709, 712, 716, 528, 928

[56] References Cited

U.S. PATENT DOCUMENTS

| | | | |
|---|---|---|---|
| 3,260,986 | 7/1966 | Staffel | 339/198 GA |
| 4,179,172 | 12/1979 | Godsey et al. | 339/17 LM |
| 4,381,878 | 5/1983 | Lechner et al. | 339/14 R |
| 4,401,351 | 8/1983 | Record | 339/17 N |
| 4,503,484 | 3/1985 | Moxon | 361/395 |
| 4,558,914 | 12/1985 | Prager et al. | 339/75 R |
| 4,595,250 | 6/1986 | Joly et al. | 339/17 LM |
| 4,658,375 | 4/1987 | Onogi et al. | 361/393 |

FOREIGN PATENT DOCUMENTS 165434 12/1985 European Pat. Off. .
1815041 12/1968 Fed. Rep. of Germany .

OTHER PUBLICATIONS

Siemens List ST, 1984, pp. 6, 8, 9.

Primary Examiner—Neil Abrams
Attorney, Agent, or Firm—Kenyon & Kenyon

[57] ABSTRACT

An automating assembly for electrical installations comprises a plurality of input and output modules each detachably fastened to a respective modular module carrier removably attached to a support bar. The module carriers each include an integrated circuit connectable to the integrated circuits of adjacent module carriers by means of rigidly mounted plug strips and cooperating jack strips connected to the integrated circuits of the module carriers via flat flexible cables. Each modular module carrier is connected to a respective terminal block for the coupling of external wires to the automating assembly. The module carriers are designed to facilitate the removal of individual module carriers for applications in which a reduced number of input and output modules is required.

26 Claims, 6 Drawing Sheets

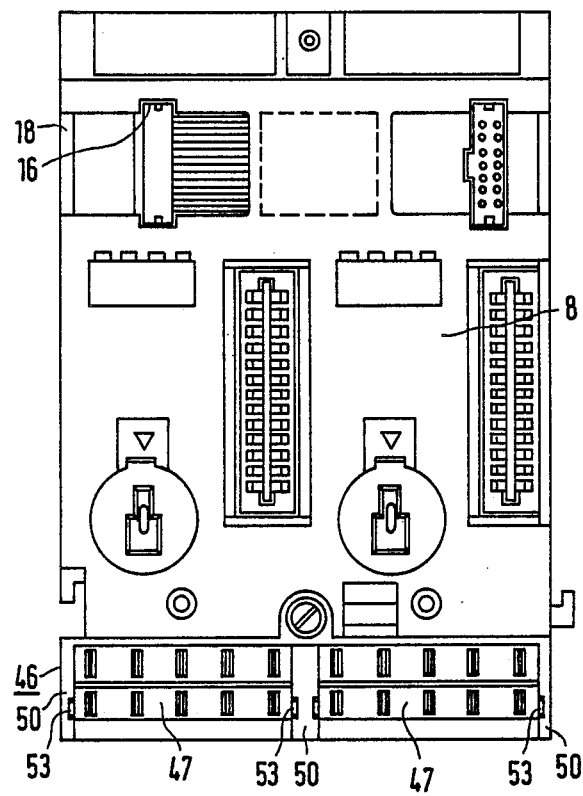
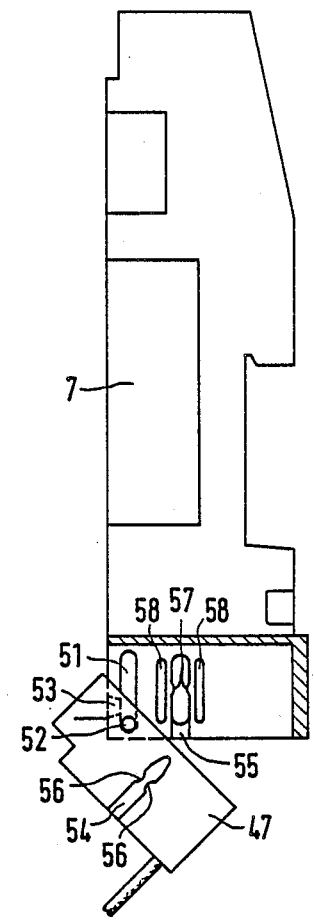
FIG 9
FIG 10

ELECTRICAL ASSEMBLY WITH MODULAR CARRIERS FOR SIGNAL PROCESSING MODULES

BACKGROUND OF THE INVENTION

This invention relates to an electrical automation unit or automating assembly comprising a plurality of electrical signal processing modules removably attached to a module carrier in turn snapped onto a support bar.

In a known automation unit of this type described in Siemens List ST 51, 1984, pages 8 and 9, ten module plug-in locations on a module carrier are connected to each other via a bus line, the module carrier being snapped onto a standard support bar. In this automation unit, if only two input or output modules are required, the remaining module plug-in locations are empty and unused.

An object of the present invention is to provide an improved automation unit or automating assembly of the abovedescribed type.

Another, more particular, object of the present invention is to provide such an automating assembly with a simple and safe design whereby a reduced number of input and output modules can be used while minimizing the amount of ancillary equipment in the automating assembly.

SUMMARY OF THE INVENTION

An electrical automating assembly in accordance with the present invention comprises a support bar, a plurality of signal processing modules, and a plurality of modular module carriers removably attachable to the support bar. The modules are detachably fastenable to the module carriers, each of the module carriers being provided with a respective matching circuit. Plug connectors are provided on module carriers for electrically connecting each of the module carriers to adjacent module carriers. In addition, connections are provided for coupling external leads to the modules.

Each matching circuit is advantageously designed as a serial ring shift register interposed as an interface unit between the respective peripheral module and a bus interconnecting the various modules. The matching circuits permit parallel transfer of individual bits of binary information. With the matching circuits, a separate termination of the bus system is obviated.

An advantage of the present invention is that the number of module carriers connected to each other via the plug connections is no more than the number required for the coupling or mounting of the requisite number of input and output modules for the particular application.

Pursuant to another feature of the present invention, the module carriers each include a respective plug connector and a respective jack connector, one of those connectors being rigidly mounted to the respective module carrier while the other connector is connected to the matching circuit of the carrier via a flexible line. Preferably, the plug connector is rigidly mounted to the module carrier, while the jack connector is connected via the flexible line. In addition, each module carrier is advantageously provided with a pocket for holding the respective jack connector when that connector is disconnected. The pocket serves to prevent damage to the jack connector, while the connection of the jack to the matching circuit via the flexible line enables a limited motion of the individual input or output modules relative to each other without detrimental effects on the plug connections.

Pursuant to another feature of the present invention, external leads are coupled to the modules by means of a plurality of terminal blocks equal in number to the module carriers, each of the terminal blocks being detachably fastened to a respective module carrier. The terminal blocks and the modules are provided with jack contacts and plug contacts coacting therewith to establish electrical connection between the modules and respective terminal blocks upon attachment of the modules to the module carrier and the terminal blocks. The module carriers and the modules are provided with cofunctioning plug and jack contacts for establishing electrical contact between the modules upon attachment thereof to the module carriers and the terminal blocks. Pursuant to this feature of the invention, a module carrier may be removed or exchanged without having to detach the external wiring, the connections of the external wiring to the automating unit being made via the associated separate terminal block. In addition, it is to be noted that connections of the modules to each other are automatically formed upon insertion or attachment of the modules to the module carriers.

In accordance with yet another feature of the present invention, the modules and the module carriers are respectively provided with eccentric pins and insertion slots for facilitating attachment of the modules to the module carriers via a rotary motion. The eccentric pins cooperate with respective insertion slots during application of the rotary motion to tighten the pins in the respective slots.

Preferably, the terminal blocks are provided with crimp and/or snap-in connections between the lead wires and the jack terminals, so that internal connections and screw terminals are not necessary. In addition, it is possible to provide a module frame only with the number of jack terminals required in the individual application.

To minimize the size of the module carriers and/or the terminal blocks, it is advantageous to provide each terminal block with a movable mounting frame shiftable prior to the insertion or removal of a module from the respective terminal block and the associated module carrier. It is of further advantage if each mounting frame is movable into a tilted position transversely to the plug-in direction of the jack terminals of the respective terminal block. In addition, to ensure that the jack terminals of a terminal block are in the correct position with respect to each mounting frame of the terminal block when a module is inserted or attached, the mounting frame is detented in the operating position with the terminal block.

The attachment of the modules to the module carriers and associated terminal blocks via a rotary motion, implemented by means of the eccentric pins and the cooperating insertion slots, serves to prevent, in the event of extreme shocks, a motion of the parts connected to each other via the plug connections and additionally precludes contact failures.

The module carriers are each provided with hooks engageable with adjacent module carriers for limiting motion of the carriers in a direction parallel to the support bar upon attachment of the module carriers thereto. The hooks enable a snap-on procedure and permit a replacement of a module carrier even though it may be connected to the support bar between two flanking module carriers.

Pursuant to a particular feature of the present invention, each module carrier is provided with a spring element engageable with the support bar for automatically forming a ground connection through the support bar upon attachment of the module carrier thereto.

The module carriers may be provided with stepwise rotatable discs for indicating codes associated with the respective module carriers. These codes serve to prevent modules from being connected to the module carriers at incorrect points along the automating assembly. A notice can be provided on a module as to the position in which a coding disc must be disposed for connecting the module to the module carrier having the coding disc. The coding discs are set with the appropriate coding during installation of the automating assembly by an expert.

The modules may be provided with projecting collars and partitions and the module carriers and terminal blocks with corresponding recesses for receiving the collars and partitions during attachment of the modules to the module carriers and the terminal blocks. The mating collars and partitions, on the one hand, and the recesses, on the other hand, serve to prevent voltage leakage between the modules, the module carriers and the terminal blocks.

An automating assembly in accordance with the present invention advantageously includes a distributor component which is removably attachable to the support bar and operatively connectable to at least one of the module carriers for operatively coupling the module carriers to additional module carriers on another support bar. The distributor component is advantageously connectable to the support bar of the assembly.

BRIEF DESCRIPTION OF THE DRAWING

FIG. 9 is a front elevational view of a module carrier with a second embodiment of a terminal block in accordance with the present invention.

FIG. 10 is a longitudinal cross-sectional view of the module carrier and terminal block of FIG. 9, showing a mounting frame of the terminal block in a swung-out position.

DETAILED DESCRIPTION

Figure 1:
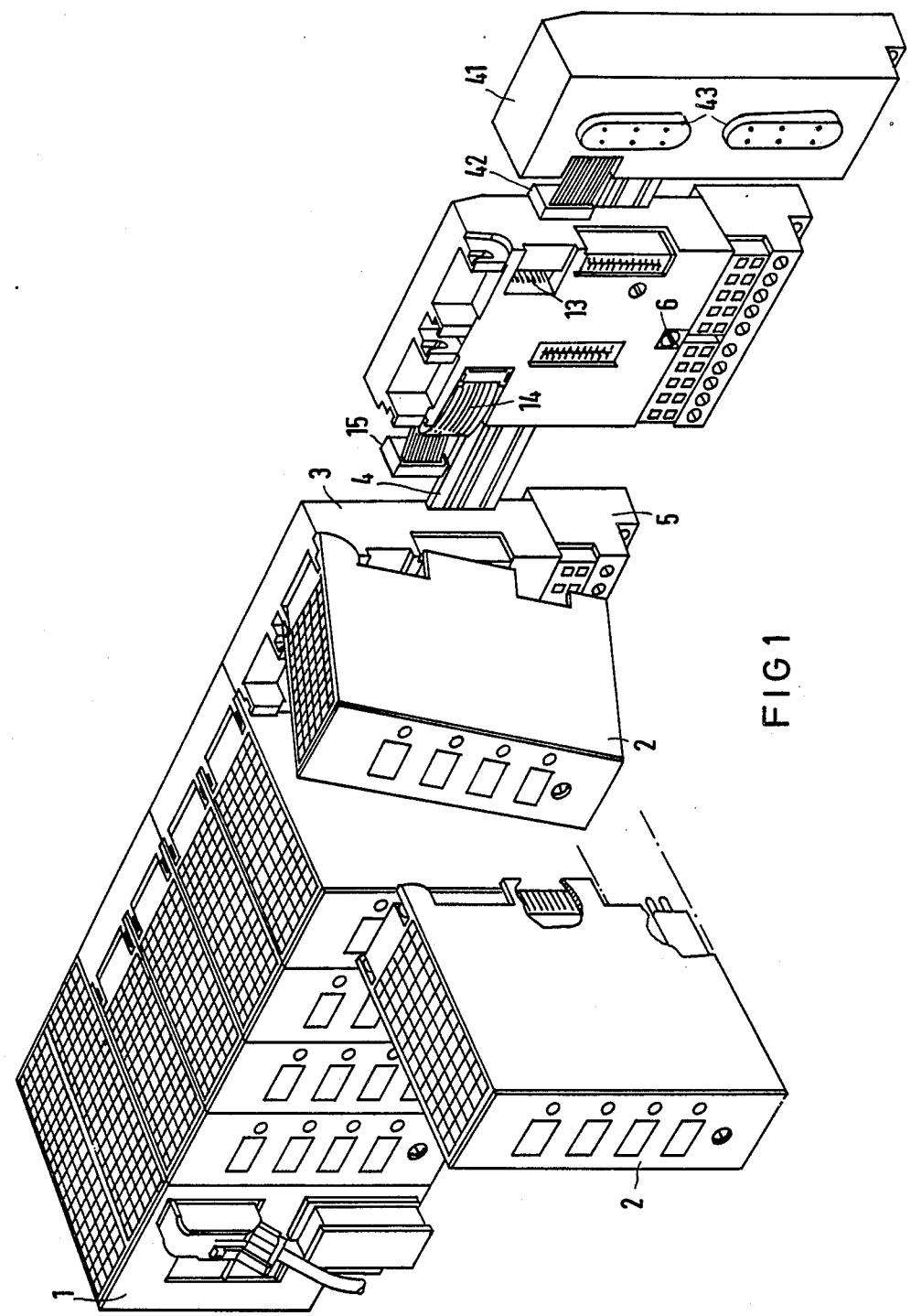
FIG. 1 is a perspective view of a automating assembly in accordance with the present invention, with several input and output modules removed for purposes of clarity.

As illustrated in FIG. 1, an electrical automating assembly comprises a central control unit 1 and input and output modules 2, as well as module carriers 3 detachably fastened to a support bar 4 in a snap-lock fit. External wiring connections to the input and output modules 2 are implemented via terminal blocks 5 attached via screws 6 to respective module carriers 3. Modules 2 are removably fastenable to the module carriers 3 via a rotary or tilting motion, as indicated in FIG. 1.

Figure 4:
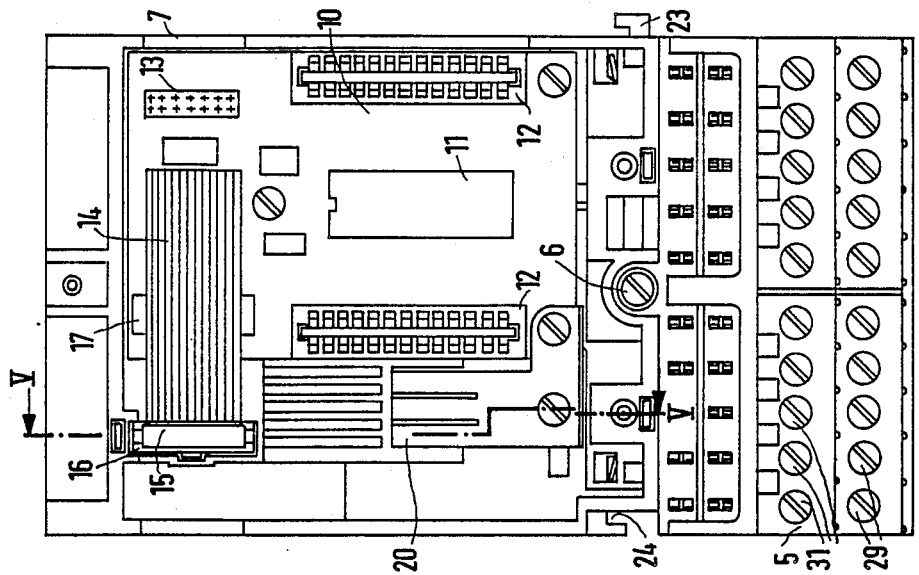
FIG. 4 is a front elevational view similar to FIG. 3, showing the modular carrier of that drawing figure with a cover section removed.
Figure 5:
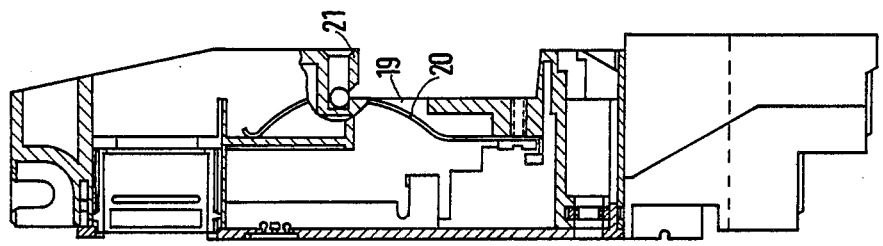
FIG. 5 is a cross-sectional view taken along line V—V in FIG. 4.
Figure 3:
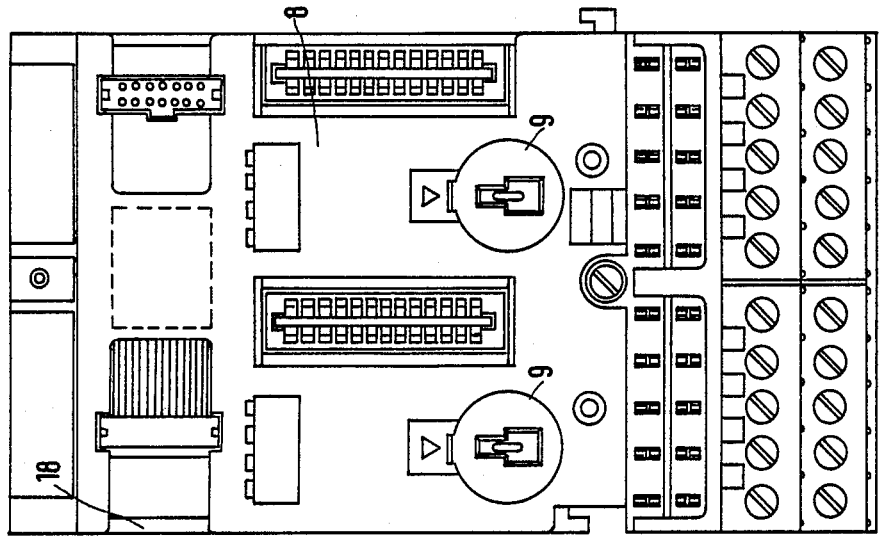
FIG. 3 is a front elevational view of a module carrier illustrated in FIG. 1.
Figure 7:
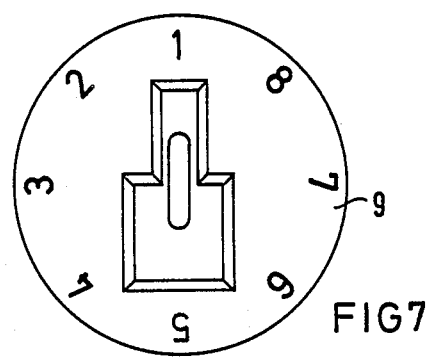
FIG. 7 is a top view of a module coding disc attached to a module carrier in accordance with the present invention.
Figure 8:
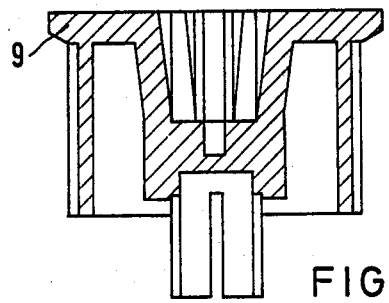
FIG. 8 is an axial cross-sectional view taken through the coding disc of FIG. 7.

As illustrated in FIGS. 3-5, each module carrier 3 comprises a main body portion 7 provided with a cover part 8 generally in the form of a plate. In order to provide a code or sign to ensure the attachment of modules 2 at proper locations along a row of module carriers 3, each module carrier is provided on its respective cover part 8 with a pair of coding discs or dials 9, the detailed structure of which discs is shown in FIGS. 7 and 8. Each module 2 is provided with a corresponding extension which cooperates with the coding dial in a key and lock manner to prevent the attachment of a module 2 to an inappropriate module carrier 3 or at an inappropriate position on a module carrier. In accordance with the embodiment illustrated in the drawing, two input and output signal processing modules 2 can be attached to each module carrier 3.

As shown in FIGS. 3-5, each module carrier 3 is provided on main body portion 7 with a circuit board 10 containing a matching circuit in the form of a integrated circuit (IC) 11. The matching circuit is a serial ring shift register interposed as an interface unit between the input/output modules 2 and a communication bus. The matching circuit allows parallel transfer of individual bits of binary information. The matching circuit obviates necessity of using a separate termination for the bus system.

On circuit board 10 of main body portion 7, jack strips 12 are provided for receiving plug contacts of the input and output modules 2 (not illustrated). For operatively coupling a pair of module carriers 3 to one another, each module carrier is provided with a plug strip 13 rigidly fastened to main body portion 7 and electrically connected to circuit board 10. In addition, each module carrier 3 is provided with a jack strip 15 electrically connected to matching circuit 11 via a flat flexible cable or line 14 coupled at a free end to jack strip 15 and at an anchored end to a terminal strip 17 on circuit board 10. Flexible cable 14 can be brought out laterally through an opening 18 in cover plate 8. In a connected state of a module carrier 3, jack strip 15 is connected to plug strip 13 of the immediately adjacent module carrier. In a disconnected state of module carrier 3, jack strip 15 is held in a pocket 16 in the associated carrier.

Each module carrier 3 is electrically connected to ground via a ground-contacting spring 20 (FIG. 5) protruding through a cutout 19 in main body portion 7 and engaging support bar 4. Ground-contacting spring 20 is conductively coupled to circuit board 10.

Figure 2:
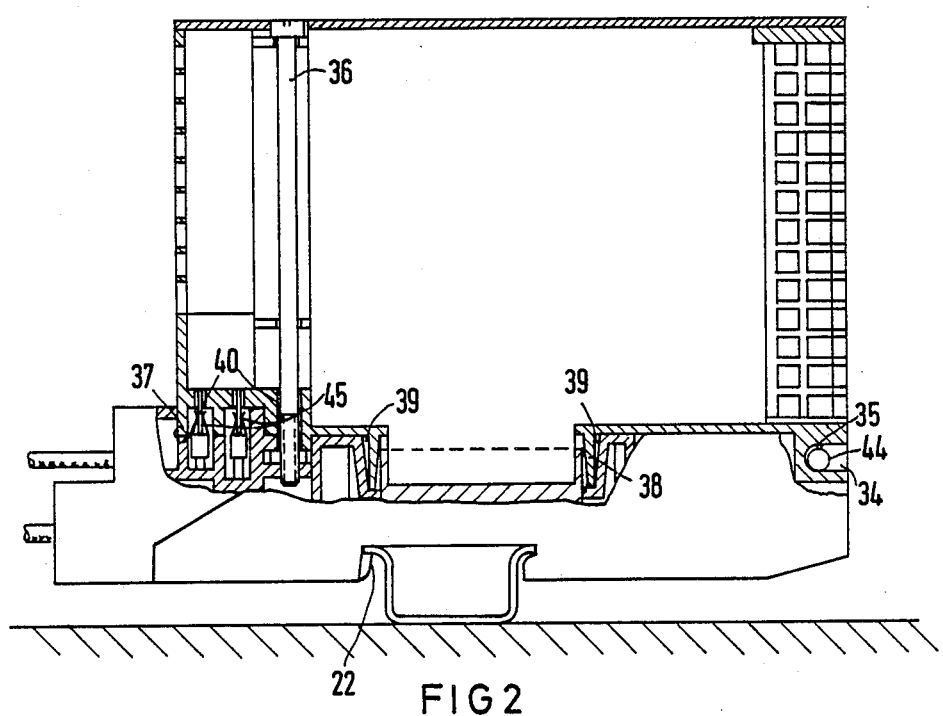
FIG. 2 is a cross-sectional view of a module connected via a respective module carrier and a respective terminal block to a support bar shown in FIG. 1.

Each module carrier 3 is hung on support bar 4 by means of projection 21 (FIG. 5) and, upon tilting of the module carrier, is detented to the support bar by a spring-loaded latch 22 (FIG. 2). As shown in FIGS. 3 and 4, projections 23 laterally protruding from main body part 7 module carrier 3 engage, upon a swinging in of the module carriers, support bar 4 in recesses 24 of the adjacent module carriers 3. Projections 23 and recesses 24 cooperate to hook module carriers 3 together to thereby prevent a shifting of the carriers relative to each other in the longitudinal direction defined by support bar 4. Projections or hooks 23 and recesses 24 are so designed that a module carrier can be interchanged without removing adjacent module carriers from support bar 4.

Figure 6:
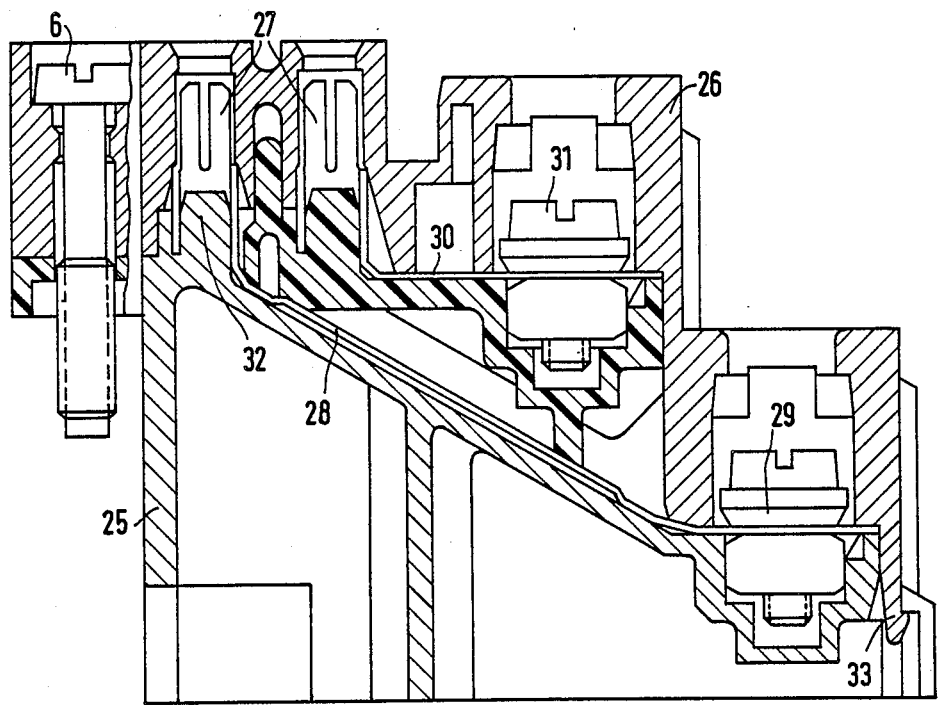
FIG. 6 is a cross-sectional view taken through a terminal block illustrated in FIG. 1.

As illustrated in FIGS. 5 and 6, each terminal block 5, in one embodiment thereof, comprises a lower part or main body portion 25 and a cover part 26. Jack contacts 27 for forming an electrical connection to a pair of modules 2 are located in cover part 26 and rest on insulating spacers 32. Each jack contact 27 is electrically coupled to a respective connecting screw 29 or 31 via a respective ribbon conductor 28 or 30. Lower part 25 and cover part 26 of terminal block 5 are connected to one another via a snap-in coupling 33 and thereby hold the inserted contact elements 27, 28, 29, 30 and 31.

Terminal block 5 is designed, in accordance with particular applications, as a screw terminal, a plug terminal, a crimp terminal or other known terminal. The terminal block may remain at the point of installation in the event that the associated module carrier 3 is removed and fastening screw 6 is untightened. The external connecting lines coupled to screw terminals 29 and 31 need not be detached.

As illustrated in FIG. 2, each module is formed with a pivot pin 44 receivable into a corresponding slot 34 in a module carrier 3. Slots 34 end in the shape of semicircles while pivot pins 34 each have an eccentric formation 35 so that a rotating of a module 2 during attachment thereof to a respective module carrier results in a tightening between the module and the module carrier. Upon the rotary attachment motion, the module is secured to the module carrier 3 via an elongate screw 36. Modules 3 are provided with collars 37 and partitions 38 which protrude into corresponding slots or recesses 39 in module carrier 3 or in a terminal block 40 (a second embodiment) in order to avoid stray voltages.

As depicted in FIG. 1, the automating assembly may include a distributor module or component 41. With the intervention of distributor module 41, input and output modules (not shown) fastened to another support bar (not shown) can be controlled by and supplied with electrical power from central unit 1. Distributor component 41 is detachably fastened to support bar 4 in a snap-lock connection and is electrically coupled to modules 2 via a jack strip 42 linked to the plug strip 13 of an adjacent module carrier 3.

Figure 11:
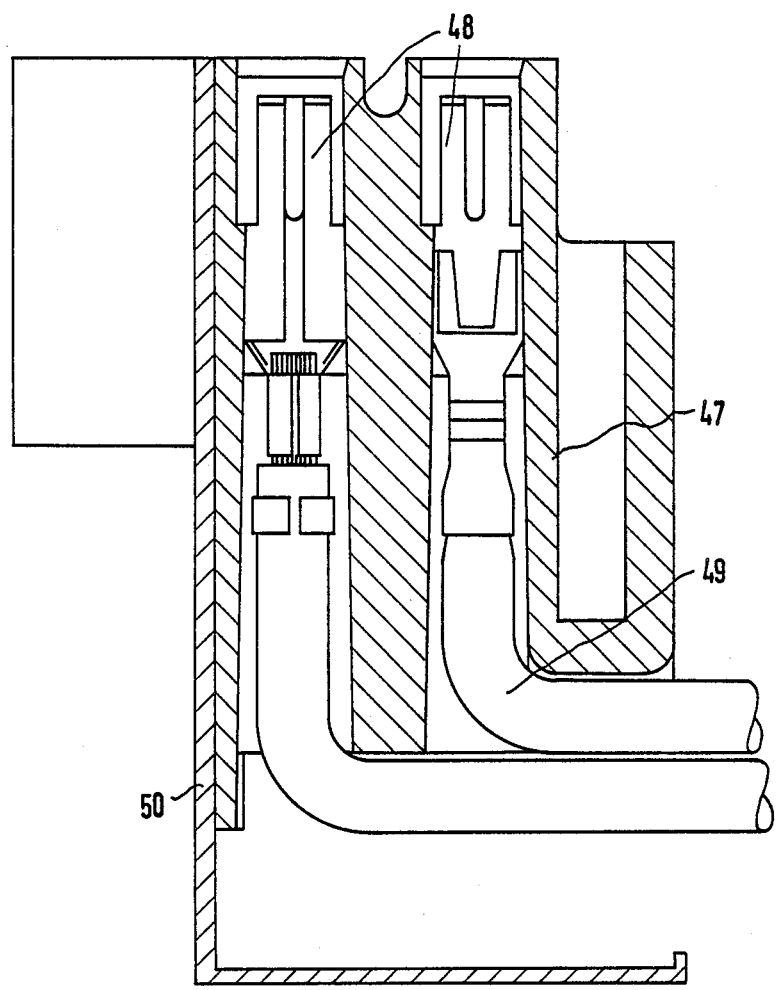
FIG. 11 is a cross-sectional view of the terminal block and mounting frame of FIG. 9.

In an alternative embodiment of terminal block 5, illustrated in FIGS. 9–11, the terminal block has a lower part or body 46 with two mounting frames 47 in which jack contacts 48 (FIG. 11) are disposed. Jack contacts 48 are electrically or conductively connected to lead wires 49 by means of a crimp and/or snap-in connection. Lower part or body 46 has side walls 50 (FIGS. 10 and 11) formed with elongate recesses or slots 51 traversed by pivot pins 52 (FIG. 10) on mounting frames 47. Pivot pins 52 are inserted into guiding slots 51 via respective introducing slots 53. Lateral walls of mounting frames 47 are provided with guiding springs 54 insertable into respective guiding slots 55 on the inside of side walls 50, as shown in FIG. 10. To enable introduction of guiding springs 54 into guiding slots 55, the respective mounting frame 47 is positioned in an inclined orientation (as illustrated in FIG. 10) such that pivot pins 52 engage edges of guiding recesses 51 on a side of terminal block 5 opposite the module carrier 3.

Mounting frame 47 is then swung in such a manner that guiding springs 54 are aligned with guiding slots 55 whereby mounting frame 47 can be shifted in a linear direction towards module carrier 3. Guiding springs 54 are provided on opposite sides with a pair of recesses or indentations 56 which receive respective detent dimples 57 provided in side walls 50 along the sides of slots 55. Detent dimples 57 engage in indentations 56 in a snap-lock fit owing to the formation of elongate cut-outs 58 in side walls 50 on opposite sides of each slot or recess 55.

In the embodiment of terminal block 5 depicted in FIGS. 9–11, external wires can be connected to module carriers 3 in a simple manner by the conventional crimp and/or snap-in technique. Mounting frame 47 is pushed out of lower part 46 of terminal block 5 until pivot pins 52 are arrested by the ends of guiding recesses 51. Thereupon mounting frame 47 is swung into the position shown in FIG. 10. The jack terminals are introduced into corresponding channels in mounting frame 47 and are detented therein. Lead wires 49 (FIG. 11) are bent at 90° angles whereupon mounting frame 47 can be returned to the operating position as described hereinabove.

An automating assembly in accordance with the present invention is completely modular and can therefore be varied in size depending on the required number of input and output modules 2. The corresponding number of module carriers are snapped onto support bar 4 and connected to each other via jack strips 15 and plug strips 13. It is not necessary to connect unused module carriers to the support bar.

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the descriptions and illustrations herein are proffered by way of example to facilitate comprehension of the invention and should not be construed to limit the scope thereof.

What is claimed is:

1. An electrical automating assembly comprising:
   a support bar;
   a plurality of signal processing modules;
   a plurality of modular carriers removably attached to said support bar, said modules being detachably fastened to said module carries, each of said module carries being provided with a respective matching circuit;
   conductive means for electrically connecting each of said module carries to adjacent module carriers, said conductive means including on each of said module carriers a respective plug connector and a respective jack connector, one of said respective plug connector and said respective jack connector being rigidly mounted to the respective module carrier and the other of said respective plug connector and said respective jack connector being connected to the matching circuit of said respective module carrier via a respective flexible line, each of said module carriers being provided with means including a pocket for holding said respective flexible line and said other of said respective plug connector and said respective jack connector in a disconnected state thereof; and coupling means for connecting external leads to said modules.

2. The assembly defined in claim 1 wherein said respective plug connector is rigidly mounted to said respective module carrier.

3. The assembly defined in claim 2 wherein said coupling means includes a plurality of terminal blocks having means for connecting to said external leads, said terminal blocks being equal in number to said module carriers, each of said terminal blocks being detachably fastened to a respective one of said module carries, said terminal blocks and said modules being provided with means including jack contacts and plug contacts for establishing electrical connection between said modules and respective ones of said terminal blocks upon attachment of said modules to said module carriers and said terminal blocks.

4. The assembly defined in claim 3 wherein said module carriers and said modules are provided with tilting means for facilitating attachment of said modules to said module carriers via a rotary motion 5. The assembly defined in claim 4 wherein said tilting means includes an eccentric pin on each of said modules and an insertion slot on each of said module carriers, the eccentric pins cooperating with respective insertion slots during application of said rotary motion to tighten the pins in the respective slots.

6. The assembly defined in claim 5 wherein said module carriers are each provided with means including hooks engageable with adjacent module carriers for limiting motion of said module carriers in a direction parallel to said support bar upon attachment of said module carriers thereto.

7. The assembly defined in claim 6 wherein said module carriers are each provided with means including a spring element engageable with said support bar for automatically forming a ground connection upon attachment of the module carriers to said support bar.

8. The assembly defined in claim 7 wherein at least one of said module carriers is provided with means including a stepwise rotatable disc for indicating a code associated with said at least one of said module carriers.

9. The assembly defined in claim 8 wherein said modules are provided with projecting collars and partitions and said module carriers and said terminal blocks are provided with recesses, said collars and said partitions being matingly received in said recesses.

10. The assembly defined in claim 9, further comprising means including a distributor component removably attached to said support bar and operatively connected to at least one of said module carriers for operatively coupling said module carriers to additional module carriers on another support bar.

11. The assembly defined in claim 10 wherein said terminal blocks each include a mounting frame tiltably fastened to the respective terminal block.

12. The assembly defined in claim 11 wherein said mounting frame is provided with jack contacts in turn connected to lead wires.

13. The assembly defined in claim 12 wherein said mounting frame is shiftable into a tilted position transversely to the plug-in direction of the jack contacts provided on said tilting frame.

14. The assembly defined in claim 13 wherein said mounting frame is snapped onto the respective terminal block in the operating position.

15. The assembly defined in claim 1 wherein said coupling means includes a plurality of terminal blocks having means for connecting to said external leads, said terminal blocks being equal in number to said module carries, each of said terminal blocks being detachably fastened to a respective one of said module carriers, said terminal blocks and said modules being provided with means including jack contacts and plug contacts for establishing electrical connection between said modules and respective ones of said terminal blocks upon attachment of said modules to said module carriers and said terminal blocks.

16. The assembly defined in claim 15 wherein said module carriers and said modules are provided with tilting means for facilitating attachment of said modules to said module carriers via a rotary motion.

17. The assembly defined in claim 16 wherein said tilting means includes an eccentric pin on each of said modules and an insertion slot on each of said module carriers, the eccentric pins cooperating with respective insertion slots during application of said rotary motion to tighten the pins in the respective slots.

18. The assembly defined in claim 15 wherein said modules are provided with projecting collars and partitions and said module carriers and said terminal blocks are provided with recesses, said collars and said partitions being matingly received in said recesses.

19. The assembly defined in claim 15 wherein said terminal blocks each include a mounting frame tiltably fastened to the respective terminal block.

20. The assembly defined in claim 19 wherein said mounting frame is provided with jack contacts in turn connected to lead wires.

21. The assembly defined in claim 20 wherein said mounting frame is shiftable into a tilted position transversely to the plug-in direction of the jack contacts provided on said tilting frame.

22. The assembly defined in claim 21 wherein said mounting frame is snapped onto the respective terminal block in the operating position.

23. The assembly defined in claim 1 wherein said module carriers are each provided with means including hooks engageable with adjacent module carriers for limiting motion of said module carriers in a direction parallel to said support bar upon attachment of said module carriers thereto.

24. The assembly defined in claim 1 wherein said module carriers are each provided with means including a spring element engageable with said support bar for automatically forming a ground connection upon attachment of the module carriers to said support bar.

25. The assembly defined in claim 1 wherein at least one of said module carriers is provided with means including a stepwise rotatable disc for indicating a code associated with said at least one of said module carriers.

26. The assembly defined in claim 1, further comprising means including a distributor component removably attachable to said support bar and operatively connectable to at least one of said module carriers for operatively coupling said module carriers to additional module carriers on another support bar.

* * * * *